United States Patent
Mahajan et al.

(10) Patent No.: US 9,837,574 B2
(45) Date of Patent: Dec. 5, 2017

(54) ANNEAL TECHNIQUES FOR CHALCOGENIDE SEMICONDUCTORS

(71) Applicant: International Business Machines Corporation, Armonk, NY (US)

(72) Inventors: Sunit S. Mahajan, Somers, NY (US); Teodor K. Todorov, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/137,275

(22) Filed: Apr. 25, 2016

(65) Prior Publication Data

US 2016/0237561 A1    Aug. 18, 2016

Related U.S. Application Data

(62) Division of application No. 14/499,116, filed on Sep. 27, 2014, now Pat. No. 9,349,906.

(51) Int. Cl.
*H01L 31/18*    (2006.01)
*H01L 31/032*    (2006.01)
(Continued)

(52) U.S. Cl.
CPC .......... *H01L 31/18* (2013.01); *C23C 14/0629* (2013.01); *C23C 14/24* (2013.01);
(Continued)

(58) Field of Classification Search
CPC ........... H01L 31/0322; H01L 21/02568; H01L 21/02631; H01L 31/18; H01L 21/02579; H01L 31/0326; H01L 31/0749
See application file for complete search history.

(56) References Cited

U.S. PATENT DOCUMENTS 8,440,497 B2    5/2013    Guha et al.
8,501,526 B2    8/2013    Teeter et al.
(Continued)

OTHER PUBLICATIONS

M. Kauk et al., "Effects of sulphur and tin disulphide vapour treatments of Cu2ZnSnS(Se)4 absorber materials for monograin solar cells," Energy Procedia, vol. 10, Dec. 2011, pp. 197-202.

C.M. Fella et al., "Cu2ZnSnSe4 absorbers processed from solution deposited metal salt precursors under different selenization conditions," Physica Status Solidi A, vol. 209, No. 6, Apr. 2012, pp. 1043-1048.

(Continued)

*Primary Examiner* — Tony Tran
(74) *Attorney, Agent, or Firm* — Vazken Alexanian; Michael J. Chang, LLC

(57) ABSTRACT

Techniques for precisely controlling the composition of volatile components (such as sulfur (S), selenium (Se), and tin (Sn)) of chalcogenide semiconductors in real-time—during production of the material are provided. In one aspect, a method for forming a chalcogenide semiconductor material includes providing a S source(s) and a Se source(s); heating the S source(s) to form a S-containing vapor; heating the Se source(s) to form a Se-containing vapor; passing a carrier gas first through the S-containing vapor and then through the Se-containing vapor, wherein the S-containing vapor and the Se-containing vapor are transported via the carrier gas to a sample; and contacting the S-containing vapor and the Se-containing vapor with the sample under conditions sufficient to form the chalcogenide semiconductor material. A multi-chamber processing apparatus is also provided.

13 Claims, 4 Drawing Sheets

(51) Int. Cl.

| | |
|---|---|
| *C23C 14/06* | (2006.01) |
| *C23C 14/24* | (2006.01) |
| *C23C 16/455* | (2006.01) |
| *C23C 16/46* | (2006.01) |
| *C23C 16/52* | (2006.01) |

(52) U.S. Cl.
CPC ............ *C23C 16/455* (2013.01); *C23C 16/46* (2013.01); *C23C 16/52* (2013.01); *H01L 31/0322* (2013.01); *H01L 31/0324* (2013.01); *H01L 31/0326* (2013.01)

(56) References Cited

U.S. PATENT DOCUMENTS

| | | | |
|---|---|---|---|
| 2003/0186164 A1* | 10/2003 | Miyamoto | G11B 7/2403 430/270.13 |
| 2012/0100663 A1 | 4/2012 | Bojarczuk et al. | |
| 2012/0238054 A1 | 9/2012 | Ionkin et al. | |
| 2013/0037090 A1 | 2/2013 | Bag et al. | |
| 2013/0217177 A1 | 8/2013 | Wong et al. | |
| 2013/0221489 A1 | 8/2013 | Cao et al. | |
| 2014/0261665 A1 | 9/2014 | Joglekar | |

OTHER PUBLICATIONS

S.C. Riha et al., "Compositionally Tunable $Cu_2ZnSn(S_{1-x}Se_x)_4$ Nanocrystals: Probing the Effect of Se-Inclusion in Mixed Chalcogenide Thin Films," Journal of the American Chemical Society, vol. 133, No. 39, Sep. 2011, pp. 15272-15275.

T.K. Todorov et al, "High-Efficiency Solar Cell with Earth-Abundant Liquid-Processed Absorber," Advanced Materials 22, E156-E159 (Feb. 2010).

A. Redinger et al., "The Consequences of Kesterite Equilibria for Efficient Solar Cells," J. Am. Chem. Soc. 133, 3320-3323 (Feb. 2011).

J.J. Scragg et al., "Chemical Insights into the Instability of $Cu_2ZnSnS_4$ Films during Annealing," Chem. Mater., 23(20), pp. 4625-4633 (Sep. 2011).

Mitzi et al., "The path towards a high-performance solution-processed kesterite solar cell," Solar Energy Materials & Solar Cells 95 (Jun. 2011) 1421-1436.

A. Weber et al., "On the Sn loss from thin films of the material system Cu—Zn—Sn—S in high vacuum," Journal of Applied Physics 107, 013516 (Jan. 2010).

List of IBM Patents or Applications Treated as Related.

* cited by examiner

ANNEAL TECHNIQUES FOR CHALCOGENIDE SEMICONDUCTORS

CROSS-REFERENCE TO RELATED APPLICATIONS

This application is a divisional of U.S. application Ser. No. 14/499,116 filed on Sep. 27, 2014, the contents of which are incorporated by reference herein.

FIELD OF THE INVENTION

The present invention relates to chalcogenide semiconductors such as kesterite and chalcopyrite materials and more particularly, to techniques for precisely controlling the composition of volatile components (such as sulfur (S), selenium (Se), and tin (Sn)) of chalcogenide semiconductors via real-time anneal atmosphere composition control during production of the material.

BACKGROUND OF THE INVENTION

The ratio of sulfur (S) to selenium (Se) in chalcogenide (e.g., chalcopyrite, kesterite) semiconductors is important for optimal band gap and/or band gap grading. See, for example, T. K. Todorov et al, "High-Efficiency Solar Cell with Earth-Abundant Liquid-Processed Absorber," Advanced Materials 22, E156-E159 (February 2010). Device-quality material formation typically occurs at temperatures above 450° C. at which S, Se and other key constituents such as zinc (Zn) metal and tin (Sn) chalcogenides are volatile. Furthermore the volatility of Sn species and Sn depletion of the CZTS can strongly depend on the chalcogen type and vapor pressure in the anneal atmosphere (see, for example, A. Redinger et al., "The Consequences of Kesterite Equilibria for Efficient Solar Cells," J. Am. Chem. Soc. 133, 3320-3323 (February 2011) (hereinafter "Redinger") and J. J. Scragg et al., "Chemical Insights into the Instability of $Cu_2ZnSnS_4$ Films during Annealing," Chem. Mater., 23(20), pp. 4625-4633 (September 2011) (hereinafter "Scragg")). Therefore precise real time atmosphere composition control during fabrication is important in order to achieve optimal equilibrium reaction conditions and achieve the targeted profile of volatile species in the material.

With conventional processes, atmosphere compositions of S and Se are often controlled using gases such as hydrogen sulfide ($H_2S$) or hydrogen selenide ($H_2Se$). $H_2S$ and $H_2Se$ are however highly toxic. There is a considerable expense associated with using and maintaining these gases safely. There are currently no straightforward methods for chalcogenide-dependent Sn vapor control in the anneal atmosphere.

Thus, techniques for effectively regulating S, Se and (optionally Sn) anneal atmosphere composition during device-grade chalcogenide semiconductor production without the use of toxic components such as $H_2S$ and $H_2Se$ would be desirable.

SUMMARY OF THE INVENTION

The present invention provides techniques for precisely controlling the composition of volatile components (such as sulfur (S), selenium (Se), and tin (Sn)) of chalcogenide semiconductors via real-time anneal atmosphere control—during production of the material. In one aspect of the invention, a method for forming a chalcogenide semiconductor material is provided. The method includes the steps of: providing at least one sulfur source and at least one selenium source; heating the at least one sulfur source to form a sulfur-containing vapor; heating the at least one selenium source to form a selenium-containing vapor; passing a carrier gas first through the sulfur-containing vapor and then through the selenium-containing vapor, wherein the sulfur-containing vapor and the selenium-containing vapor are transported via the carrier gas to a sample containing at least one precursor component of the chalcogenide semiconductor material; and contacting the sulfur-containing vapor and the selenium-containing vapor with the sample under conditions sufficient to form the chalcogenide semiconductor material.

In another aspect of the invention, a multi-chamber processing apparatus is provided. The apparatus includes a sequence of chambers connected in series such that an outlet of one of the chambers is connected to an inlet of an adjacent one of the chambers in the sequence; at least one sulfur source in the first chamber in the sequence; at least one selenium source in a second chamber in the sequence; optionally at least one tin source in a third chamber in the sequence; and a source of a carrier gas connected to the first chamber in the sequence.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for precisely controlling the composition of the volatile components (such as sulfur (S), selenium (Se), and/or tin (Sn)) of a chalcogenide semiconductor in real-time—during production of the material. As highlighted above, control over the ratio of S to Se in chalcogen semiconductor materials is an important factor in optimizing band gap and/or band gap grading. Conventional processes however often employ highly toxic gases such as hydrogen sulfide ($H_2S$) and hydrogen selenide ($H_2Se$) for sulfurization/selenization purposes. Costly measures must then be put in place to insure that these gases are used and maintained safely. By contrast, the present techniques advantageously employ elemental sources of sulfur and selenium. Elemental sulfur and selenium are significantly less toxic than their sulfide and selenide counterparts. Further, as will be described in detail below, the present techniques involve the production of discrete amounts of sulfur- and selenium-containing vapor that, once no longer needed, rapidly condense back to a non-gaseous form.

The term "chalcogenide semiconductor material," as used herein, refers generally to any semiconductor material having at least one chalcogen. Generally, elements from group 16 of the periodic table of elements are considered as chalcogens. Notably, however, in semiconductor device technology, S and Se are most often the chalcogens of interest. Exemplary chalcogenide semiconductors which can be formed in accordance with the present techniques include, but are not limited to, materials containing copper (Cu), indium (In), gallium (Ga), and at least one of S and Se (abbreviated herein as "CIGS") and materials containing Cu, zinc (Zn), Sn and at least one of S and Se (abbreviated herein as "CZTS").

Figure 1:
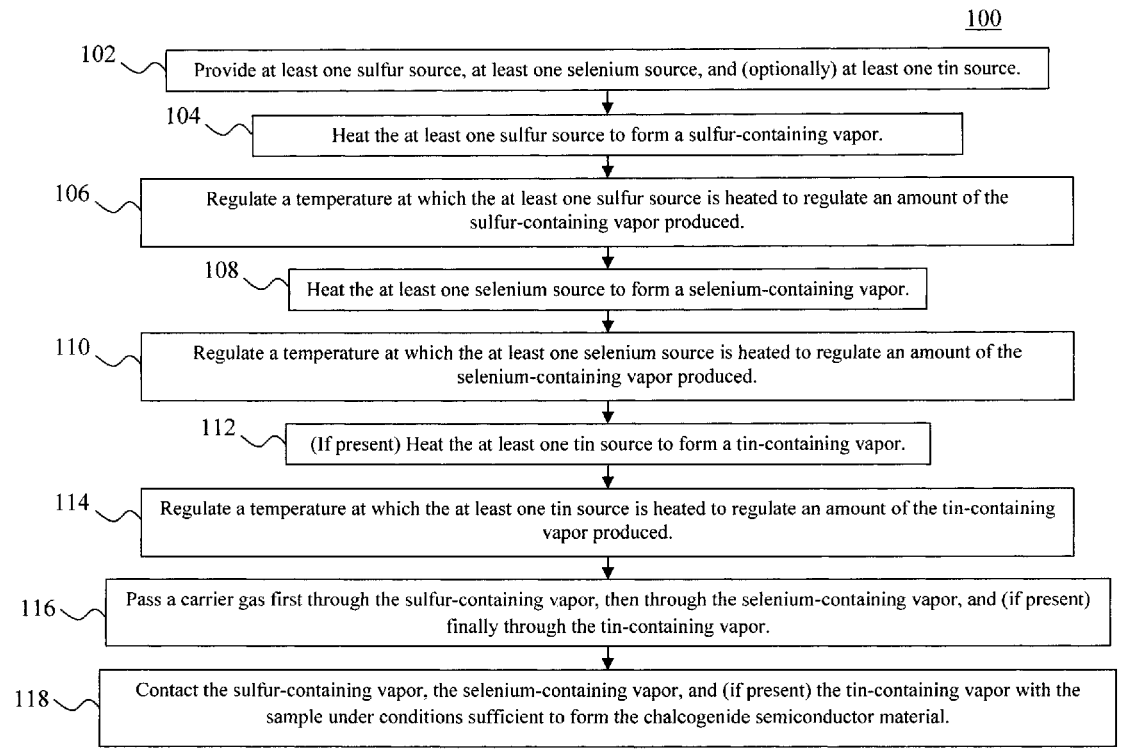
FIG. 1 is a diagram illustrating an exemplary methodology for forming a chalcogenide semiconductor material according to an embodiment of the present invention.

In general, the present techniques involve passing a carrier gas consecutively through heated elemental or compound sources starting with the lowest temperature to the highest temperature thus simplifying equipment design and increasing reliability of the process control. An overview of the present techniques is now presented by way of reference to methodology 100 of FIG. 1. While methodology 100 will be described in the context of forming a chalcogenide semiconductor material, it is to be understood that the present techniques are more broadly applicable to any fabrication process in which precise control of one or more volatile components is desirable.

In step 102, at least one S source and at least one Se source are provided. As highlighted above, the present techniques will be used to control the S to Se ratio in the chalcogenide semiconductor material. Additionally, in some exemplary embodiments presented herein, other volatile components of the material are also optionally controlled via the present process. For instance, kesterite materials also include volatile components such as Sn. An exemplary kesterite material is one containing copper (Cu), zinc (Zn), Sn and at least one of S and Se (CZTS). Controlled amounts of Sn may also be introduced during the present process. In that case, in step 102, at least one source of Sn is also provided. An exemplary multi-chamber processing apparatus will be described below wherein each source material (e.g., S, Se, and optionally Sn) is located within a separate chamber in sequence based on boiling points of the sources.

According to an exemplary embodiment, the S source is elemental S and the Se source is elemental Se. The use of elemental sources avoids the toxic sulfides and selenides commonly employed in other processes.

According to an exemplary embodiment, when present, the Sn source is a Sn-containing compound. Regarding chalcogenide materials that contain Sn such as CZTS, the volatile nature of Sn at temperatures commonly employed during processing make the precise composition of the material difficult to control. Namely, when kesterite samples are heated above 400° C., reevaporation of Sn occurs causing desorption and loss of Sn from the samples. See, for example, Mitzi et al., "The path towards a high-performance solution-processed kesterite solar cell," Solar Energy Materials & Solar Cells 95 (June 2011) 1421-1436, the contents of which are incorporated by reference as if fully set forth herein. It is notable that the Sn lost due to desorption is however generally not elemental Sn, but occurs primarily in the form of tin sulfide (SnS). See, for example, A. Weber et al., "On the Sn loss from thin films of the material system Cu—Zn—Sn—S in high vacuum," Journal of Applied Physics 107, 013516 (January 2010) (hereinafter "Weber"), the contents of which are incorporated by reference as if fully set forth herein. Carrying out high temperature anneals (even at temperatures of 550° C. or above) in a sulfur environment can thus mitigate the loss of Sn. See Weber. Therefore, it is preferable to use a compound Sn source that contains sulfur and/or selenium rather than elemental tin. According to an exemplary embodiment, the Sn source is a solid Sn-containing compound selected from tin (II) sulfide (SnS), tin (IV) sulfide ($SnS_2$), tin sulfoselenide ($Sn(S/Se)_x$), and combinations including at least one of the forgoing compounds. The toxicity of these low vapor pressure sulfide and selenide materials is less of an issue compared to volatile metalorganic sources due to quick condensation and easy separation as soon as the temperature of the exhaust gas drops.

Preferably, excess amounts of the (S, Se, and/or Sn) sources are provided in step 102. By "excess" it is meant that greater amounts of the (S, Se, and/or Sn) sources are provided in step 102 than are contained in a single sample in order to shift the solid-gas equilibria at elevated temperatures towards desired kesterite/chalcopyrite phase and composition. Thus, the same sources may be used in multiple iterations of methodology 100 to prepare multiple samples. Further, since the present process permits real-time control over the composition of each of the source components, the same sources (S, Se, and/or Sn) provided in step 102 can be used in multiple runs to produce chalcogenide semiconductor materials having different compositions.

It is notable that in many applications what is important is the amount of one component relative to one or more other components of the material. For instance, in the case of a kesterite or chalcopyrite material, the volatility of certain components makes the composition of the material difficult to control. Simply providing excess amounts of these volatile components (e.g., amounts of these components in excess of what is needed to satisfy the stoichiometric requirements of the end product) can serve to compensate for their loss due to evaporation during processing. Excess amounts of the volatile components can be removed from the sample by heating up the sample to a sufficient temperature (so that these elements have a sufficient vapor pressure) and for a sufficient time to evaporate the excess from the surface of the sample. See, for example, U.S. Patent Application Publication Number 2013/0037090 filed by Bag et al., entitled "Capping Layers for Improved Crystallization," the contents of which are incorporated by reference as if fully set forth herein. However, beyond simply providing excess volatile components to compensate for their loss during processing, the present techniques advantageously permit adjustment of the ratios of the components relative to one another. For instance, as highlighted above, band gap tuning in kesterite and chalcopyrite semiconductor materials is carried out by controlling the S to Se ratio in the material. By way of the present techniques, precise control over the ratio of volatile components such as S and Se can be easily achieved.

In step 104, the S source is heated to form a S-containing vapor. As will be described in detail below, a carrier gas will be passed through the S-containing vapor. In step 104, the S source is heated to saturate the carrier gas with the S vapor at the given temperature (see below). The S concentration in the carrier gas is directly related to the temperature to which the S source is heated in step 104 (preferably a temperature above its melting point—however some vapor will form even below this temperature) and contact of the S source with the carrier gas. Regarding temperature, according to an exemplary embodiment the S source is heated to a given temperature of from about 180° C. to about 300° C., and ranges therebetween to saturate the carrier gas with the S-containing vapor at the given temperature. Regarding contact of the S source with the carrier gas, sufficient contact between the S source and the carrier gas can be achieved, e.g., by bubbling the carrier gas through molten sulfur (see, for example, FIG. 2—described below). Sufficient contact insures that the S concentration at every given temperature and pressure is constant. According to an exemplary embodiment, the S concentration in the carrier gas is from about 0.1% to about 20%, and ranges therebetween. As provided above, the present techniques advantageously permit precise regulation of the volatile components used in chalcogenide semiconductor material formation, such as S, Se, and (optionally) Sn. For instance, the precise S to Se ratio employed is important for band gap tuning and/or for band gap grading. According to the present techniques, the ratio of S to Se produced in vapor form can be easily regulated by regulating the temperature of the respective sources. Thus, according to an exemplary embodiment, in step 106 the temperature at which the at least one S source is heated is regulated to thereby regulate an amount of the S-containing vapor produced.

Having the ability to regulate the amount of S (as well as that of the Se and Sn (if Sn if present)—see below) in this manner permits real-time control of the composition of the chalcogenide semiconductor material, i.e., control over the composition of the material while it is being formed. For instance, to regulate the S to Se ratio, one simply has to regulate the temperature of the S source relative to the Se source, or vice versa. It is further noted that once the source is permitted to cool, the source will condense (back to its solid or liquid form). As provided above, it is preferable to provide excess amounts of each of the sources (i.e., amounts of the sources in excess of what is needed to treat a single sample) such that the same sources provided in step 102 can be used in multiple iterations of methodology 100 to process multiple samples (of potentially different composition). In that case, the composition of the chalcogenide semiconductor materials produced in each iteration can, if desired, be varied in real-time from one iteration to another by simply (independently) regulating the temperature of the sources (as per step 106 for S and steps 110 and 114 for Se and Sn, respectively—see below).

In step 108, the Se source is heated to form a Se-containing vapor. As will be described in detail below, the carrier gas will be passed through the Se-containing vapor. In step 108, the Se source is heated to saturate the carrier gas with the Se vapor at the given temperature (see below). The Se concentration in the carrier gas is directly related to the temperature to which the Se source is heated in step 108 (preferably a temperature above its melting point—however some vapor will form even below this temperature) and contact of the Se source with the carrier gas. Regarding temperature, according to an exemplary embodiment the Se source is heated to a given temperature of from about 300° C. to about 450° C., and ranges therebetween to saturate the carrier gas with the Se-containing vapor at the given temperature. Regarding contact of the Se source with the carrier gas, sufficient contact between the Se source and the carrier gas can be achieved, e.g., by passing the gas over molten selenium in an elongated container (see, for example, FIG. 2—described below). Sufficient contact insures that the Se concentration at every given temperature and pressure is constant. According to an exemplary embodiment, the Se concentration in the carrier gas is from about 0.1% to about 20%, and ranges therebetween. As provided above, the present techniques advantageously permit precise regulation of the volatile components used in chalcogenide semiconductor material formation, such as S, Se, and (optionally) Sn. For instance, the precise S to Se ratio employed is important for band gap tuning and/or for band gap grading. According to the present techniques, the ratio of S to Se produced in vapor form can be easily regulated by regulating the temperature of the respective sources. Thus, according to an exemplary embodiment, in step 110 the temperature at which the at least one Se source is heated is regulated to thereby regulate an amount of the Se-containing vapor produced.

Increasing the temperature for either the S source or the Se source will increase the relative amount of S- or Se-containing vapor, respectively. Experimental data illustrating the effect of source temperature variation on S to Se ratio of the component vapor is provided below. With regard to tuning the band gap of a chalcogenide semiconductor material, it is notable that pure CZTSe (i.e., 100 percent (%) Se) has a band gap of 0.96 electron volts (eV) and pure CZTS (i.e., 100% S) has a band gap of 1.5 eV. Thus by way of the present techniques the band gap of a chalcogenide semiconductor material can be tuned within that range by varying the S to Se ratio.

In step 112, the Sn source (if present) is heated to form a Sn-containing vapor. Step 112 is optional since a vapor source of Sn may not be needed in all applications (such as in the case where the chalcogenide semiconductor material (e.g., CIGS) does not contain Sn). As will be described in detail below, the carrier gas will be passed through the Sn-containing vapor (if present). In step 112, the Sn source is heated to saturate the carrier gas with the Sn vapor at the given temperature (see below). The Sn concentration in the carrier gas is directly related to the temperature to which the Sn source is heated in step 112 and contact of the Sn source with the carrier gas. Regarding temperature, according to an exemplary embodiment the Sn source is heated to a given temperature of from about 500° C. to about 800° C., and ranges therebetween to saturate the carrier gas with the Sn-containing vapor at the given temperature. Regarding contact of the Sn source with the carrier gas, sufficient contact between the Sn source and the carrier gas can be achieved, e.g., by passing the gas over solid tin in an elongated container (see, for example, FIG. 2—described below). Sufficient contact insures that the Sn concentration at every given temperature and pressure is constant. According to an exemplary embodiment, the Sn concentration in the carrier gas is from about 0.1% to about 20%, and ranges therebetween. As provided above, the present techniques advantageously permit precise regulation of the volatile components used in chalcogenide semiconductor material formation, such as S, Se, and in this case Sn. Thus, according to an exemplary embodiment, in step 114 the temperature at which the at least one Sn source is heated is regulated to thereby regulate an amount of the Sn-containing vapor produced. From the above description, it is apparent that according to the present techniques the temperature profiles of the different sources and therefore the concentrations of volatile components in the carrier gas can optionally be varied independently during the course of the process, for example supplying higher concentration at higher temperatures of lower vapor pressure components such as Sn in order to produce optimal semiconductor properties.

In step 116, a carrier gas is passed first through the S-containing vapor, then through the Se-containing vapor, and finally (if present) through the Sn-containing vapor. The S-containing vapor, the Se-containing vapor, and the (optional) Sn-containing vapor are transported via the carrier gas to a sample. Suitable carrier gases include, but are not limited to, helium, nitrogen, and argon gas.

According to an exemplary embodiment, the sample contains at least one precursor component of the chalcogenide semiconductor material. For instance, as precursor components the sample may contain at least one metal component of the chalcogenide semiconductor material (such as Cu, Zn, and/or Sn in the case of a CZTS material, or Cu, In, and/or Ga in the case of a CIGS material). Optionally, the sample may also contain a chalcogen component (e.g., S and/or Se) in a stoichiometric amount for the final composition, or amounts less or more than the stoichiometric amounts. For example, while the present techniques may serve to introduce S and Se to the sample to reach final composition, this is not the only scenario. The present techniques may also be applied when the sample has the desired S and/or Se composition and these vapors are introduced in the anneal atmosphere to prevent S and/or Se loss at the high temperatures required for proper crystallization. See, for example, Redinger and Scragg, the contents of both of which are incorporated by reference as if fully set forth herein.

By way of example only, the sample may include the precursor component(s) of the chalcogenide semiconductor material in the form of a layer or multiple layers on a substrate. The term "precursor" refers to the notion that the final composition and/or distribution of elements throughout the final chalcogenide semiconductor material will be established only after the sample has been subjected to a final high-temperature crystallization anneal, been contacted with S-, Se-, and/or (optional) Sn-containing vapor, and cooled to room temperature—see below. Thus, the elements as they presently exist in the sample are at this stage merely precursors for the final chalcogenide semiconductor material formation. Even if the precursors present in the sample represent all of the elements present in the final chalcogenide semiconductor material (for example, the precursors for a CZTS material might include each of Cu, Zn, Sn, S, and Se), the final composition of the material will not be established until the high-temperature equilibria between the solid and vapor components are reached and maintained and/or modified during the temperature ramp down. Further, since the present techniques involve the volatile components of these materials (e.g., S, Se, and/or Sn), the source of the non-volatile components of the material (e.g., the above-mentioned metals) need to be already present in the sample.

It is further noted that the S source has the lowest boiling point of all of the sources in this example. The Se source has the next lowest boiling point, followed by the Sn source (if present). By passing the carrier gas first through the S-containing vapor, followed by the Se-containing vapor and finally (if present) the Sn-containing vapor, the component-containing (S-, Se-, and/or Sn-containing) vapor always moves from a lower to a higher temperature environment. This is important, because if the component-containing vapor was to instead move from a higher to a lower temperature environment (e.g., one at a temperature below the boiling point of one (or more) of the components in the vapor), then the components would condense back to a liquid or solid and no longer be available in vapor form for reaction with the sample.

Finally, in step 118, the component-containing vapor (e.g., the S-, the Se-, and if present the Sn-containing vapor) is contacted with the sample under conditions (e.g., temperature, duration, etc.) sufficient to form the chalcogenide semiconductor material. According to an exemplary embodiment, the component-containing vapor is contacted with the sample at a temperature of from about 450° C. to about 650° C., and ranges therebetween, e.g., from about 500° C. to about 600° C., and ranges therebetween, for a duration of from about 1 second to about 24 hours, and ranges therebetween. Preferably, the temperature employed in step 118 is greater than or equal to the temperature needed to maintain the component having the highest boiling point in the vapor form. As highlighted above, this is done to prevent the vapor components from condensing. These annealing conditions (temperature and duration) in step 118 are commensurate with a final high-temperature crystallization anneal, after which the sample(s) is permitted to cool to room temperature. As provided above, it is only after the final high-temperature anneal and cool down that the final composition and/or distribution of elements throughout the final chalcogenide semiconductor material will be established.

Figure 2:
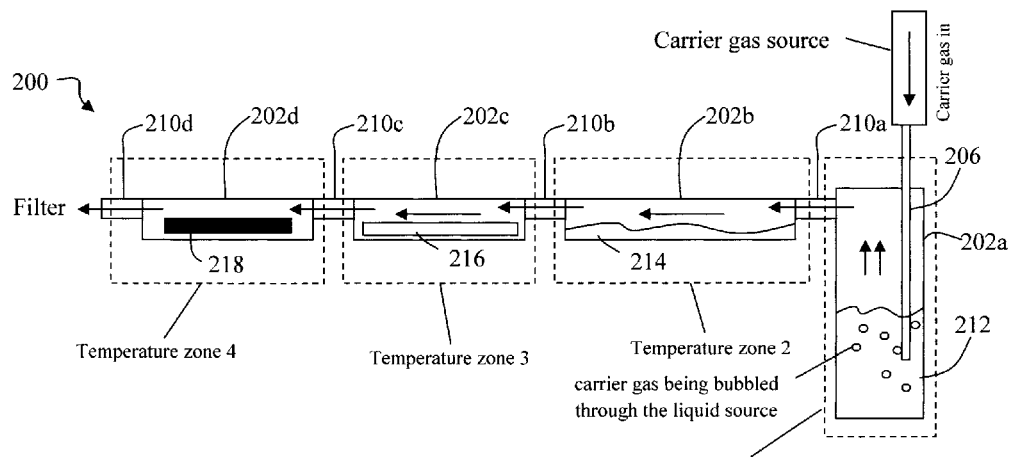
FIG. 2 is a diagram illustrating an exemplary multi-chamber processing apparatus for forming a chalcogenide semiconductor material according to an embodiment of the present invention.

According to an exemplary embodiment, methodology 100 is carried out in a multi-chamber processing apparatus, such as exemplary multi-chamber processing apparatus 200 shown illustrated in FIG. 2. Processing apparatus 200 includes a sequence of chambers 202 (i.e., chambers 202a, b, c, d, etc.), inlets and outlets of which are interconnected by gas passages 210 (i.e., gas passages 210a, b, c, d, etc.). Chambers 202a, b, c, d, etc. are connected in series such that—as will be described in detail below—the carrier gas (and with it the component-containing (i.e., S-, Se-, and/or Sn-containing) vapor) can readily pass in sequence from the first chamber to the last. According to an exemplary embodiment, each source (e.g., S source, Se source, and (optional) Sn source) is placed in a separate one of the chambers 202. Therefore, the number of chambers employed in processing apparatus 200 will depend on the number of sources and thus on the final composition of the semiconductor material being produced. Accordingly, the number of chambers 202 shown in FIG. 2 is merely one exemplary configuration intended solely to illustrate the present techniques, and more or fewer chambers 202 may be employed than is shown in FIG. 2.

Figure 4:
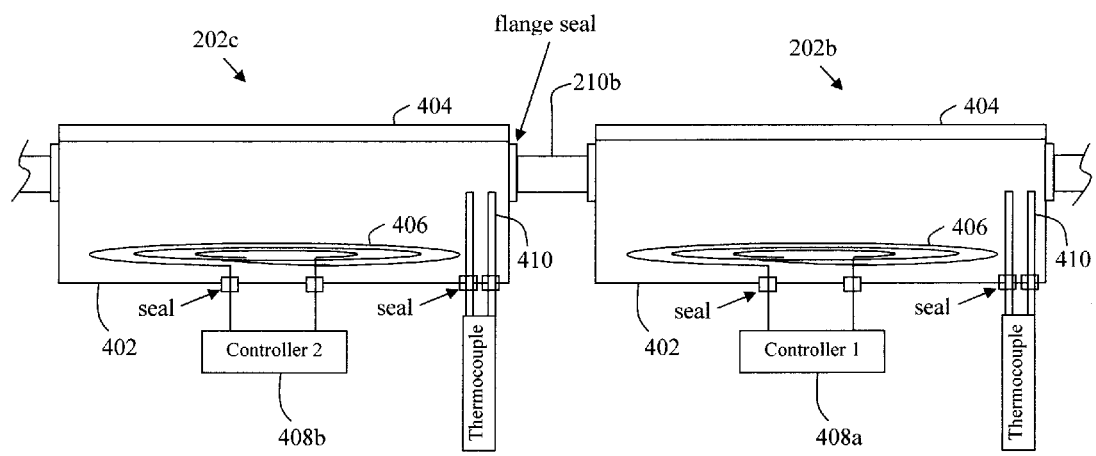
FIG. 4 is a diagram illustrating an exemplary embodiment for independently controlling and monitoring the temperature within each chamber in the multi-chamber processing apparatus of FIG. 2 according to an embodiment of the present invention.

A detailed description of the chambers 202 will be provided in conjunction with the description of FIG. 4, below. In general however, each of the chambers 202 is preferably formed from a heat resistant material such as metal, glass or plastic, and is gas-tight in the sense that the only pathway for gases into and out of the chambers is through the inlets and outlets interconnecting the chambers.

Further, the placement of the sources in the chambers 202 will be based on the boiling point of the sources such that during methodology 100 the component-containing vapor is always transported via the carrier gas from a lower temperature environment to a higher temperature environment (in this case form a lower temperature chamber to a higher temperature chamber). As described above, this insures that the components in the vapor do not condense, but rather remain in vapor form during the process. To use an illustrative example, an S source would be located in a chamber earlier in the sequence than an Se source since S has a lower boiling point than Se. Likewise, both the S source and the Se source would be located in chambers earlier in the sequence than a Sn source since both S and Se have lower boiling points than Sn, and so on. In the example shown illustrated in FIG. 2, the first three chambers 202a, 202b, and 202c contain sources 212, 214, and 216, respectively, while the fourth chamber (the last chamber in the sequences) contains the sample 218. During operation, the temperature of each of the chambers 202 is independently regulated. Each chamber 202a, 202b, 202c, and 202d is thus considered herein to be a separate temperature zone (i.e., temperature zone 1, temperature zone 2, temperature zone 3, and temperature zone 4, respectively). See FIG. 2.

Figure 3:
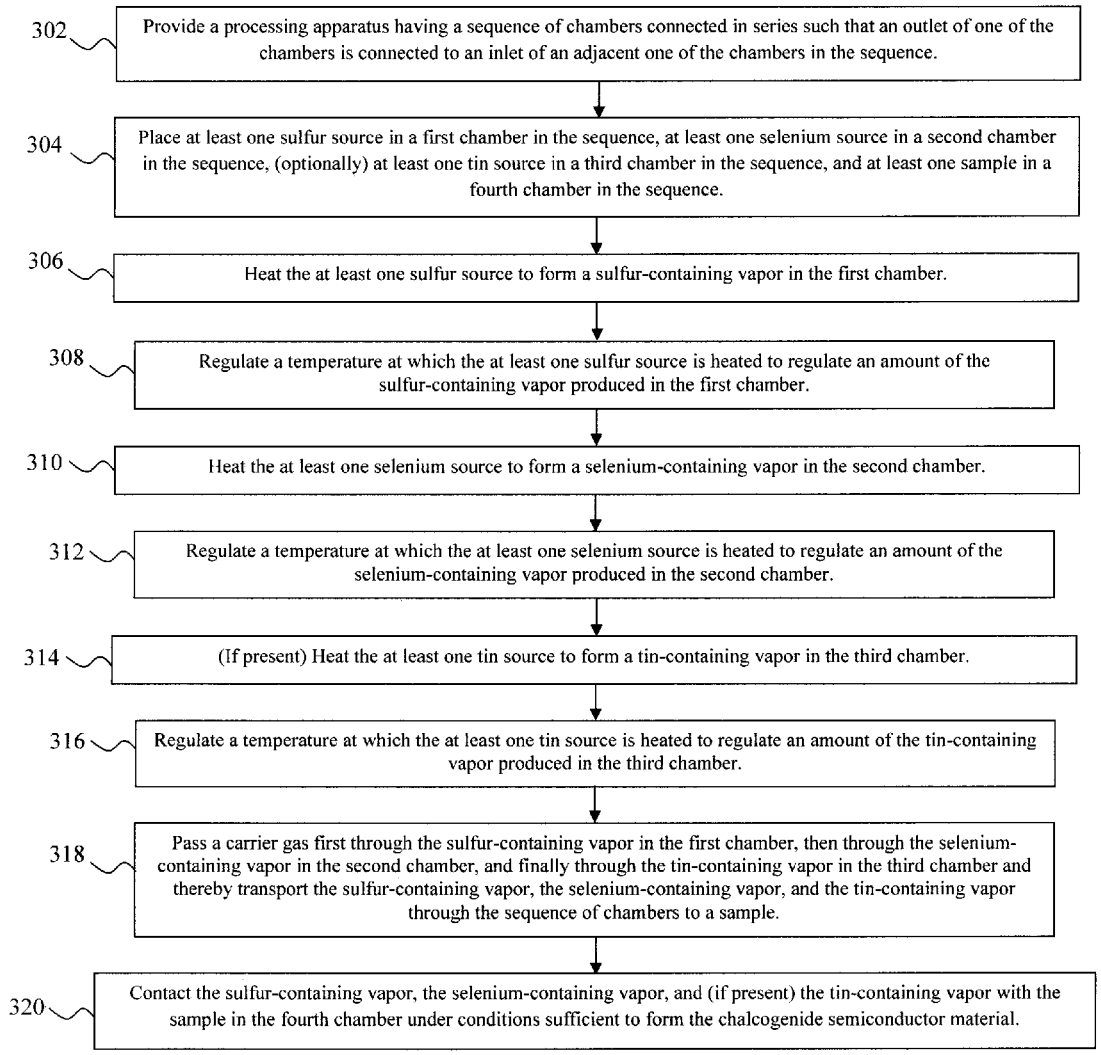
FIG. 3 is a diagram illustrating an exemplary methodology for forming a chalcogenide semiconductor material using the multi-chamber processing apparatus of FIG. 2 according to an embodiment of the present invention.

An exemplary embodiment wherein methodology 100 is performed using apparatus 200 is now described by way of reference to methodology 300 of FIG. 3. The process begins in step 302 with the multi-chamber processing apparatus 200. As described above, multi-chamber processing apparatus 200 includes a sequence of chambers 202 (i.e., chambers 202a, b, c, d, etc.) connected in series such that an outlet of each chamber is connected to an inlet of an adjacent chamber in the sequence.

In step 304, at least one S source is placed in the first chamber in the sequence and at least one Se source is placed in the second chamber in the sequence. In the exemplary processing apparatus 200 shown in FIG. 2, chamber 202a is the first chamber in the sequence and chamber 202b is the second chamber in the sequence. The order of the sequence is dictated by the direction of the flow of the carrier gas through the chambers. Arrows are used in FIG. 2 to indicate the flow of the carrier gas. As provided above, the ordering of the sources in the sequence of chambers is relevant to placing the sources in order from lowest to highest boiling point along the direction of flow of the carrier gas.

According to an exemplary embodiment, at least one Sn source is also present and in step 304 is placed in the third chamber in the sequence. Since not all implementations include Sn (such as is the case when, for example, a CIGS chalcogenide semiconductor material is being formed) a Sn source is optional. However, when present, the Sn source is placed in a chamber after both the S source and the Se source in the sequence of chambers since Sn has a higher boiling point than both S and Se. Thus, based on the direction of flow of the carrier gas through the chambers (see arrows in FIG. 2), the vapor from each source will be carried to successively higher temperature environments so as to insure that each component-containing vapor is kept at or above the boiling point of its constituent components. If the component-containing vapor was, on the other hand, transported to a chamber having a temperature below the boiling point of one or more of the vaporized components then those components would undesirably condense before reaching the sample.

As described above, suitable S and Se sources include elemental S and elemental Se, respectively. In the exemplary embodiment shown illustrated in FIG. 2, elemental S and Se sources have been heated in their respective chambers (i.e., chambers 202a and 202b) until molten. Thus, the S and Se sources are shown in FIG. 2 to be liquid (molten) sources. FIG. 2 further illustrates that when liquid sources are present it is possible to introduce the carrier gas through the liquid (i.e., the carrier gas is bubbled through the liquid source). Bubbling the carrier gas through the liquid source increases contact of the carrier gas with the component-containing vapor. This exemplary configuration is shown being implemented in (elongated) chamber 202a of apparatus 200 wherein the carrier gas is being delivered via a tube 206 to below the surface of the liquid (molten) S source 212. The carrier gas then bubbles up through the molten S source 212.

Alternatively, it is also possible to simply pass the carrier gas over the heated liquid source. This exemplary configuration is shown being implemented in chamber 202b of apparatus 200 wherein the carrier gas is simply passed over the liquid (molten) Se source 214. This example also highlights the notion that the chambers 202 of apparatus 200 do not have to have the same shape as one another. For instance, when bubbling the carrier gas through a liquid source it may be desirable to configure the chamber to be, like chamber 202a, narrow yet deeper than the other chambers which will provide (based on the path of the carrier gas through the chamber) a greater vertical contact area between the carrier gas and the component-containing vapor. Conversely, when the carrier gas is simply being passed over the surface of a liquid source it may be desirable to configure the chamber to be, like (elongated) chamber 202b, wider yet shallower than chamber 202a which will provide (based on the path of the carrier gas through the chamber) a greater horizontal contact area between the carrier gas and the component-containing vapor. The depiction of different approaches for passing the carrier gas either through or over a liquid source in FIG. 2 is meant merely to illustrate different possible techniques. It is not intended to imply that the liquid S source and the liquid Se source necessarily need to be processed differently.

In FIG. 2, the Sn source 216 is shown to be a solid. As provided above, suitable Sn sources include, but are not limited to, Sn-containing compounds such as $SnS$, $SnS_2$, and/or $Sn(S/Se)_x$. By way of example only, the Sn source 216 can consist of a layer of the Sn-containing compound that has been formed on a suitable substrate material (e.g., on a glass plate). In that case, it may also be desirable to employ an elongated chamber design that, like chamber 202b, is wide and shallow which will provide (based on the path of the carrier gas through the chamber) a greater horizontal contact area between the carrier gas and the component-containing vapor.

As shown in FIG. 2 the sample 218 is placed in the last chamber in the sequence of chambers. In this example, the last chamber is the fourth chamber 202d. As provided above, the sample contains at least one precursor component of the final chalcogenide semiconductor material, for example, at least one metal and/or at least one chalcogenide component of the chalcogenide semiconductor material. Chalcogenide semiconductor materials are often employed as absorber layer materials in photovoltaic devices. Thus, by way of example only, the sample may include at least one of the precursors for a photovoltaic device absorber layer, and formation of the absorber layer can be carried out in accordance with the present techniques. Further, it is noted that multiple samples may be treated at the same time and in the same manner described. Thus, the illustration of a single sample 218 in FIG. 2 is merely an example.

In step 306, the at least one S source 212 is heated to form a S-containing vapor in the first chamber 202a. The process for heating an elemental S source to produce a S-containing vapor was described in detail above. As also described above, the amount by which the S source is heated is directly proportional to the amount of the S-containing vapor produced. Thus, in step 308, the temperature at which the at least one S source 212 is heated is regulated to thereby regulate the amount of the S-containing vapor produced in chamber 202a. As will be described in detail, for example, in conjunction with the description of FIG. 4 below, the temperature in each chamber 202 of apparatus 200 can be independently regulated, thereby permitting independent regulation of the amount of the component-containing vapor produced in each chamber.

In step 310, the at least one Se source 214 is heated to form a Se-containing vapor in the second chamber 202b. The process for heating an elemental Se source to produce a Se-containing vapor was described in detail above. As also described above, the amount by which the Se source is heated is directly proportional to the amount of the Se-containing vapor produced. Thus, in step 312, the temperature at which the at least one Se source 214 is heated is independently regulated to thereby regulate the amount of the Se-containing vapor produced in chamber 202b.

In step 314, the at least one Sn source 214 (if present) is heated to form a Sn-containing vapor in the third chamber 202c. The process for heating a compound Sn source to produce a Sn-containing vapor was described in detail above. As also described above, the amount by which the Sn source is heated is directly proportional to the amount of the Sn-containing vapor produced. Thus, in step 316, the temperature at which the at least one Sn source 216 is heated is regulated to thereby independently regulate the amount of the Sn-containing vapor produced in chamber 202c.

In step 318, the carrier gas is then passed through the sequence of chambers beginning with the first chamber 202a. As described above, the sources are arranged in the chambers by their boiling points. Therefore, in this example, the first chamber 202a (containing the S source) is located before the second chamber 202b (containing the Se source) in the sequence of chambers, and the second chamber 202b is located before the third chamber 202c (containing the Sn source if present) in the sequence of chambers such that the carrier gas passes first through the S-containing vapor in the first chamber 202a, then through the Se-containing vapor in the second chamber 202b, and finally through the Sn-containing vapor (if present) in the third chamber 202c. The carrier gas transports the S-containing vapor, the Se-containing vapor and (if present) the Sn-containing vapor through the sequence of chambers to the sample.

As shown in FIG. 2, a source of the carrier gas is connected to the first chamber 202a. By way of example only, the carrier gas source may be a gas cylinder or tank. The gas cylinder or tank may be fitted with a pressure regulator to regulate the pressure of the carrier gas being introduced into the first chamber 202a of apparatus 200. The pressure should be high enough that the carrier gas flows in only one direction—from the first chamber to the last. According to an exemplary embodiment, the carrier gas is introduced into the first chamber at a pressure of from about 5 pounds per square inch gauge (psig) to about 100 psig, and ranges therebetween.

As highlighted above, a stream of the carrier gas will pass through each of the chambers 202 in succession picking up the component-containing vapor from each chamber it passes through. More specifically, as the carrier gas passes through the first chamber 202a it passes through the S-containing vapor present in the first chamber 202a. Since the chambers are connected in series, the carrier gas then passes from the first chamber 202a into the second chamber 202b (via gas passage 210a) transporting the S-containing vapor from the first chamber to the second chamber. As the carrier gas passes through the second chamber 202b it passes through the Se-containing vapor present in the second chamber 202b. The carrier gas stream then passes from the second chamber 202b into the third chamber 202c via gas passage 210b. As the carrier gas stream passes through the third chamber 202c it passes through the Sn-containing vapor present in the third chamber 202c. The carrier gas stream then passes from the third chamber 202c into the fourth chamber 202d via gas passage 210c. In this example, the fourth chamber contains the sample 218. As noted above, the particular number of chambers 202 present in apparatus 200 is based on the number of sources employed and thus on the particular chalcogenide semiconductor material being produced. For instance, in the case of a CIGS material, a chamber to accommodate a Sn source would not be needed.

Finally, in step 320, the component-containing vapor (e.g., the S-, the Se-, and if present the Sn-containing vapor) is contacted with the sample 218 in the fourth chamber 202d under conditions (e.g., temperature, duration, etc.) sufficient to form the chalcogenide semiconductor material. According to an exemplary embodiment, the component-containing vapor is contacted with the sample 218 at a temperature of from about 450° C. to about 650° C., and ranges therebetween, e.g., from about 500° C. to about 600° C., and ranges therebetween, for a duration of from about 1 second to about 24 hours, and ranges therebetween (which represent conditions commensurate with a final high-temperature crystallization anneal). Preferably, the temperature employed in step 320 is greater than or equal to the temperature needed to maintain the component having the highest boiling point in the vapor form. As highlighted above, this is done to prevent the vapor components from condensing.

Specifically, as the carrier gas stream passes through the fourth chamber 202d it contacts the sample 218 contained in the fourth chamber 202d. The component-containing (S-, Se-, and/or Sn-containing) vapor transported by the carrier gas reacts with the sample to form the end product chalcogenide semiconductor material. The carrier gas then transports the component-containing vapor out of the fourth chamber 202d and the apparatus 200 via gas passage 210d. As shown in FIG. 2, a filter may be employed to remove the vapor components from the carrier gas stream as it exits the last chamber of the apparatus. Membrane or electrostatic filters or other purification systems known in the art may also be employed, for example scrubbers.

As provided above, the temperature of each chamber 202 in apparatus 200 can be independently regulated to regulate the temperature at which the source contained in the chamber is heated and thereby control the amount of component-containing vapor produced in the chamber. Thus, according to the present techniques, the temperature profiles of the different sources and therefore the concentrations of volatile components in the carrier gas can optionally be varied independently during the course of the process, for example supplying higher concentration at higher temperatures of lower vapor pressure components such as Sn in order to produce optimal semiconductor properties. Independent control over the temperature of each of the chambers 202 in apparatus 200 may be achieved using a number of different heating mechanisms. For example, in its simplest form, a separate means of heating is provided for each of the chambers 202. In one exemplary embodiment, each of the chambers is equipped with its own (independently controlled) resistive heating element. See for example FIG. 4 which shows a representative implementation of separate resistive heating elements applied to each of the chambers 202. For illustrative purposes only, FIG. 4 depicts chambers 202b and 202c of apparatus 200 from FIG. 2 with the understanding that the same configuration may be employed in any of the other chambers. In the exemplary configuration shown illustrated in FIG. 4, each chamber 202 consists of a (e.g., metal, glass or plastic) enclosure 402 fitted with a gas tight removable lid 404. The lid 404 permits a source material or sample to be easily placed in/removed from the chamber. The lid 404 is gas tight to prevent the carrier gas or the component-containing vapor from leaving the chamber other than by way of the gas passages 210.

In this example, a separate resistive heating element 406 is located within each of the chambers 202. Resistive heating elements may be constructed from a strip of electrically conductive material arranged, e.g., as a coil. The ends of the resistive heating element pass from the inside to the outside of the enclosure 402 where they are connected to a controller 408. In order to independently control the temperature of each resistive heating element, each resistive heating element is connected to a separate controller 408*a, b*, etc. (labeled "Controller 1," "Controller 2," etc.). In its simplest form, each controller 408 may be an adjustable power supply. As shown in FIG. 4, a seal is used around the ends of the resistive heating element as they pass through the wall of the enclosure 402 which prevents gases from leaking out of the chamber 202. By way of example only, the seal used can be an adhesive affixing and sealing the ends of the resistive heating element to the enclosure.

Preferably, a means for monitoring the temperature in each chamber 202 is also provided. By way of example only, a separate thermocouple may be used in each chamber. See FIG. 4. As is known in the art, a thermocouple is a temperature measuring device that produces a voltage in response to changes in temperature. Depending on thermocouple type (e.g., type K, type C, type R, etc.) an appropriate material combination can be selected which will be resilient to the needed temperature changes and provide reliable readings at the desired temperatures. A suitable thermocouple device for the present apparatus includes leads 410 which pass though the enclosure to monitor the temperature within each chamber. See FIG. 4. As described above, a seal (e.g., an adhesive) is preferably employed to prevent gases escaping from the chamber where the leads 410 pass through the wall of the enclosure.

The gas passages 210 are also configured to prevent gases from escaping at the junction of the gas passages 210 and the inlets/outlets of the chambers 202. For instance in the exemplary embodiment shown illustrated in FIG. 4, each gas passage is formed from a (e.g., metal, glass or plastic) tubing that it sealed at each of its opposing ends to the respective chamber via a flange. The flange can be secured to the wall of the enclosure using mechanical fasteners (such as screws) or an adhesive.

Figure 5:
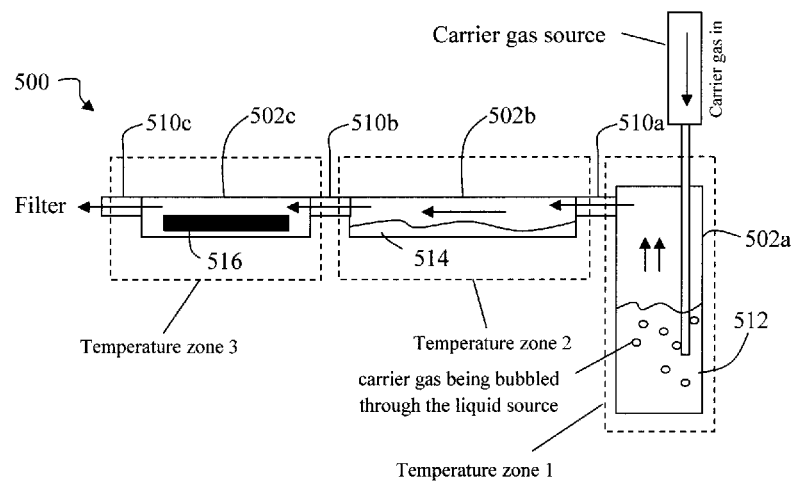
FIG. 5 is a diagram illustrating another exemplary multi-chamber processing apparatus for forming a chalcogenide semiconductor material according to an embodiment of the present invention.

As described above, the number of chambers 202 employed in apparatus 200 is based on the number of sources present and thus on the composition of the desired chalcogenide semiconductor material. While clearly stated in the above description that the chamber 202*c* shown in FIG. 2 to contain the Sn source 216 might not be needed in all cases, and is thus optional, for completeness a variation of apparatus 200 is shown in FIG. 5 (a multi-chamber processing apparatus 500) that includes a sequence of three chambers (502*a, b,* and *c*) connected in series and containing a S source 512, a Se source 514, and a sample 516, respectively. The temperature of each chamber may be independently regulated in the same manner described above. Except here, there are only 3 temperature zones. Inlets and outlets of the chambers are connected via gas passages 510 (i.e., gas passage 510*a, b,* and *c*). Methodology 100 of FIG. 1 may be carried out in multi-chamber processing apparatus 500 in the same manner as described above, except that only two sources (in this case S and Se) may be used. Thus, for instance, the Sn source would be absent. By way of example only, apparatus 200 is well suited for forming CZTS kesterite materials having three volatile components S, Se, and Sn, whereas apparatus 500 is well suited for forming CIGS chalcopyrite materials having two volatile components S and Se.

Figure 6:
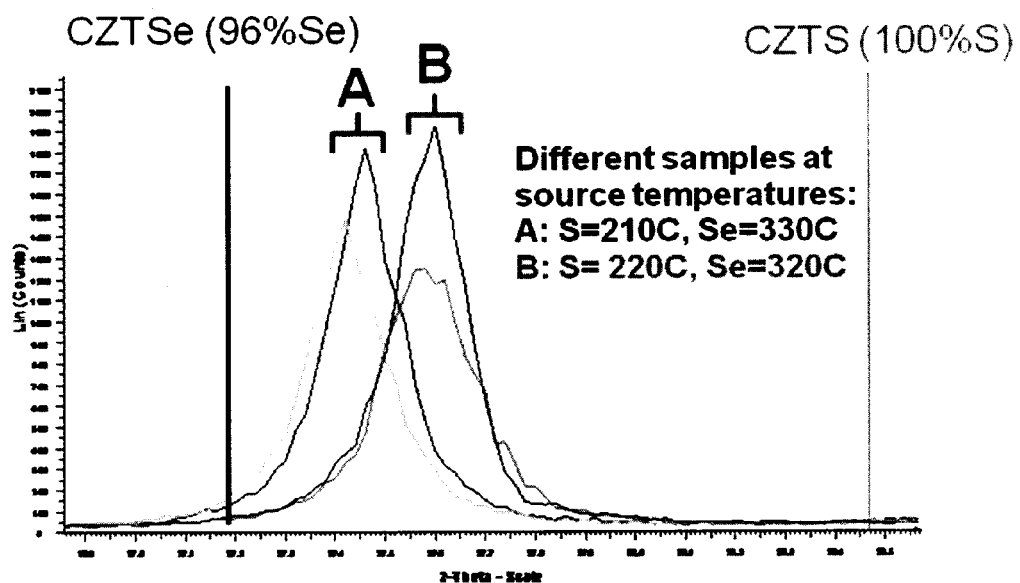
FIG. 6 is a diagram illustrating an exemplary implementation of the present techniques to control the sulfur (S) to selenium (Se) ratio in sample CZTS kesterite materials according to an embodiment of the present invention.

FIG. 6 is a diagram illustrating an exemplary implementation of the present techniques to control the S to Se ratio in sample CZTS kesterite materials. Specifically, the compositions of two CZTS samples A and B are shown. The samples were processed in accordance with the present techniques during which the S and Se source temperatures were varied. As shown in FIG. 6, an increase in the S source temperature of from 210° C. to 220° C. and a decrease in the Se source temperature of from 330° C. to 320° C. between sample A and sample B resulted in an increase in the S to Se ratio of the material. For instance, the S to Se composition of the sample A is closer to an almost pure Se kesterite (96% Se) while the S to Se composition of the sample B is closer to a pure S kesterite (100% S).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A multi-chamber processing apparatus, comprising:
   a sequence of chambers connected in series via gas passages such that an outlet of one of the chambers is connected via a gas passage to an inlet of an adjacent one of the chambers in the sequence and wherein, for at least a given one of the chambers, the inlet and the outlet are separate from one another and are located at opposite ends of the given chamber with at least one source being present within the given chamber between the inlet and the outlet;
   at least one sulfur source in a first chamber in the sequence;
   at least one selenium source in a second chamber in the sequence; and
   a source of a carrier gas connected to the first chamber in the sequence, wherein the carrier gas is passable through the sequence of chambers in series via the gas passages;
   at least one tin source in a third chamber in the sequence;
   heating elements within each of the chambers, wherein the heating elements comprise resistive heating elements, and wherein a separate resistive heating element is located with each of the chambers; and
   controllers connected to each of the heating elements, wherein each of the controllers comprises an adjustable power supply;
   wherein the carrier gas is selected from the group consisting of: helium gas, nitrogen gas, and argon gas
   wherein the at least one tin source comprises a tin-containing compound selected from the group consisting of: tin (II) sulfide, tin (IV) sulfide, tin sulfoselenide, and combinations comprising at least one of the forgoing compounds; and
   a filter at the gas passage out of a last chamber in the sequence, wherein the filter is configured to remove vapor components from a stream of the carrier gas as the stream of the carrier gas exits the last chamber in the sequence.

2. The multi-chamber processing apparatus of claim 1, further comprising a sample in a last chamber in the sequence, wherein the sample contains at least one precursor component of a chalcogenide semiconductor material.

3. The multi-chamber processing apparatus of claim 2, wherein the chalcogenide semiconductor material comprises a kesterite material, and wherein the at least one precursor component of the chalcogenide semiconductor material is selected from the group consisting of: copper, zinc, tin, sulfur, selenium, and combinations comprising at least one of the foregoing metals.

4. The multi-chamber processing apparatus of claim 2, wherein the chalcogenide semiconductor material comprises a chalcopyrite material, and wherein the at least one precursor component of the chalcogenide semiconductor material is selected from the group consisting of: copper, indium, gallium, sulfur, selenium, and combinations comprising at least one of the foregoing metals.

5. The multi-chamber processing apparatus of claim 1, wherein the at least one sulfur source comprises elemental sulfur.

6. The multi-chamber processing apparatus of claim 1, wherein the at least one selenium source comprises elemental selenium.

7. The multi-chamber processing apparatus of claim 1, wherein each of the chambers is formed from a material selected from the group consisting of: metal, glass and plastic.

8. The multi-chamber processing apparatus of claim 1, wherein each of the chambers is gas-tight such that an only pathway for gases into and out of the chambers is through the gas passages interconnecting the chambers.

9. The multi-chamber processing apparatus of claim 1, wherein the source of the carrier gas is a gas cylinder fitted with a pressure regulator to regulate a pressure of the carrier gas being introduced into the first chamber.

10. The multi-chamber processing apparatus of claim 1, wherein the source of the carrier gas is connected via a tube to the first chamber in the sequence, wherein a first end of the tube is connected to the source of the carrier gas and a second end of the tube is present below a surface of the at least one sulfur source.

11. The multi-chamber processing apparatus of claim 1, wherein at least one of the chambers has a different shape from at least one other of the chambers in the sequence.

12. The multi-chamber processing apparatus of claim 1, wherein the at least one tin source comprises a layer of the tin-containing compound disposed on a substrate.

13. The multi-chamber processing apparatus of claim 12, wherein the substrate comprises a glass plate.

* * * * *